United States Patent
Burugupalli et al.

(10) Patent No.: US 12,489,438 B2
(45) Date of Patent: Dec. 2, 2025

(54) BIAS CLAMP CIRCUIT

(71) Applicant: TEXAS INSTRUMENTS INCORPORATED, Dallas, TX (US)

(72) Inventors: Saiteja Burugupalli, Bangalore (IN); Mahadevan Venkiteswaran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 71 days.

(21) Appl. No.: 18/309,556

(22) Filed: Apr. 28, 2023

(65) Prior Publication Data
US 2024/0364323 A1 Oct. 31, 2024

(51) Int. Cl.
H03K 17/16 (2006.01)
G05F 3/20 (2006.01)

(52) U.S. Cl.
CPC .......... H03K 17/161 (2013.01); G05F 3/205 (2013.01)

(58) Field of Classification Search
CPC .... H03K 17/161; H03K 17/16; H03K 17/162; H03K 2217/0018; H03K 19/0027; G11C 5/146; G05F 3/205; H02M 3/078
See application file for complete search history.

(56) References Cited

U.S. PATENT DOCUMENTS

2006/0208787 A1* 9/2006 Callahan, Jr. ........ H03K 17/162
327/404

* cited by examiner

Primary Examiner — Jung Kim
(74) Attorney, Agent, or Firm — Mandy Barsilai Fernandez; Frank D. Cimino

(57) ABSTRACT

In some examples, an apparatus includes a first transistor, a second transistor, a third transistor, and a fourth transistor. The first transistor has a source, a gate, and a drain, the drain of the first transistor coupled to a voltage supply terminal. The second transistor has a source, a gate, and a drain, the gate of the second transistor coupled to the gate of the first transistor, and the source of the second transistor coupled to the source of the first transistor. The third transistor has a first terminal and a bulk, the bulk of the third transistor coupled to the drain of the second transistor. The fourth transistor has a first terminal and a bulk, the bulk of the fourth transistor coupled to the drain of the second transistor and the first terminal of the fourth transistor coupled to the first terminal of the third transistor.

20 Claims, 5 Drawing Sheets

BIAS CLAMP CIRCUIT

BACKGROUND

Various circuits, and circuit components, include parasitics, or parasitic elements. Parasitic elements are intrinsically, or in some cases inherently, occurring features that exist among, or between, circuit components such as conductive interconnects, doped regions of a semiconductor, etc. For example, parasitic elements include parasitic inductance, parasitic capacitance, parasitic resistance, and the formation of parasitic bi-polar junction transistors (BJTs) between doped regions of a semiconductor, such as a field-effect transistor (FET).

SUMMARY

In some examples, an apparatus includes a first transistor, a second transistor, a third transistor, and a fourth transistor. The first transistor has a source, a gate, and a drain, the drain of the first transistor coupled to a voltage supply terminal. The second transistor has a source, a gate, and a drain, the gate of the second transistor coupled to the gate of the first transistor, and the source of the second transistor coupled to the source of the first transistor. The third transistor has a first terminal and a bulk, the bulk of the third transistor coupled to the drain of the second transistor. The fourth transistor has a first terminal and a bulk, the bulk of the fourth transistor coupled to the drain of the second transistor and the first terminal of the fourth transistor coupled to the first terminal of the third transistor.

In some examples, an apparatus includes a bias clamp circuit and a differential input pair. The bias clamp circuit has a bias terminal. The bias clamp circuit is configured to prevent a value of bias voltage provided at the bias terminal from decreasing below a reference value. The differential input pair is coupled to the bias terminal. The bias clamp circuit includes a reference voltage supply, a first transistor, and a second transistor. The differential input pair includes a third transistor and a fourth transistor. The first transistor has a source, a gate, and a drain, the gate of the first transistor coupled to the reference voltage supply, and the drain of the first transistor coupled to a voltage supply terminal. The second transistor has a source, a gate, and a drain, the gate of the second transistor coupled to the reference voltage supply, the source of the second transistor coupled to the source of the first transistor, and the drain of the second transistor coupled to the bias terminal. The third transistor has a first terminal and a bulk, the bulk of the third transistor coupled at the bias terminal to the drain of the second transistor. The fourth transistor has a first terminal and a bulk, the bulk of the fourth transistor coupled to the drain of the second transistor and the first terminal of the fourth transistor coupled to the first terminal of the third transistor.

In some examples, a system includes an input circuit having first and second inputs and first and second outputs. The input circuit includes a differential input pair, a bias clamp circuit, a differential amplifier, and a switching circuit. The differential input pair includes a first transistor having a gate, a first terminal, and a bulk, in which the gate of the first transistor is the first input of the input circuit, and a second transistor having a gate, a first terminal, and a bulk, the bulk of the second transistor coupled to the bulk of the first transistor, and the first terminal of the fourth transistor coupled to the first terminal of the third transistor, in which the gate of the second transistor is the second input of the input circuit. The bias clamp circuit is coupled to the bulks of the first and second transistors. The differential amplifier has an output and first and second inputs, the first input of the differential amplifier coupled to the first output of the input circuit, and the second input of the differential amplifier coupled to the second output of the input circuit. The switching circuit is coupled to the output of the differential amplifier.

DETAILED DESCRIPTION

Figure 1:
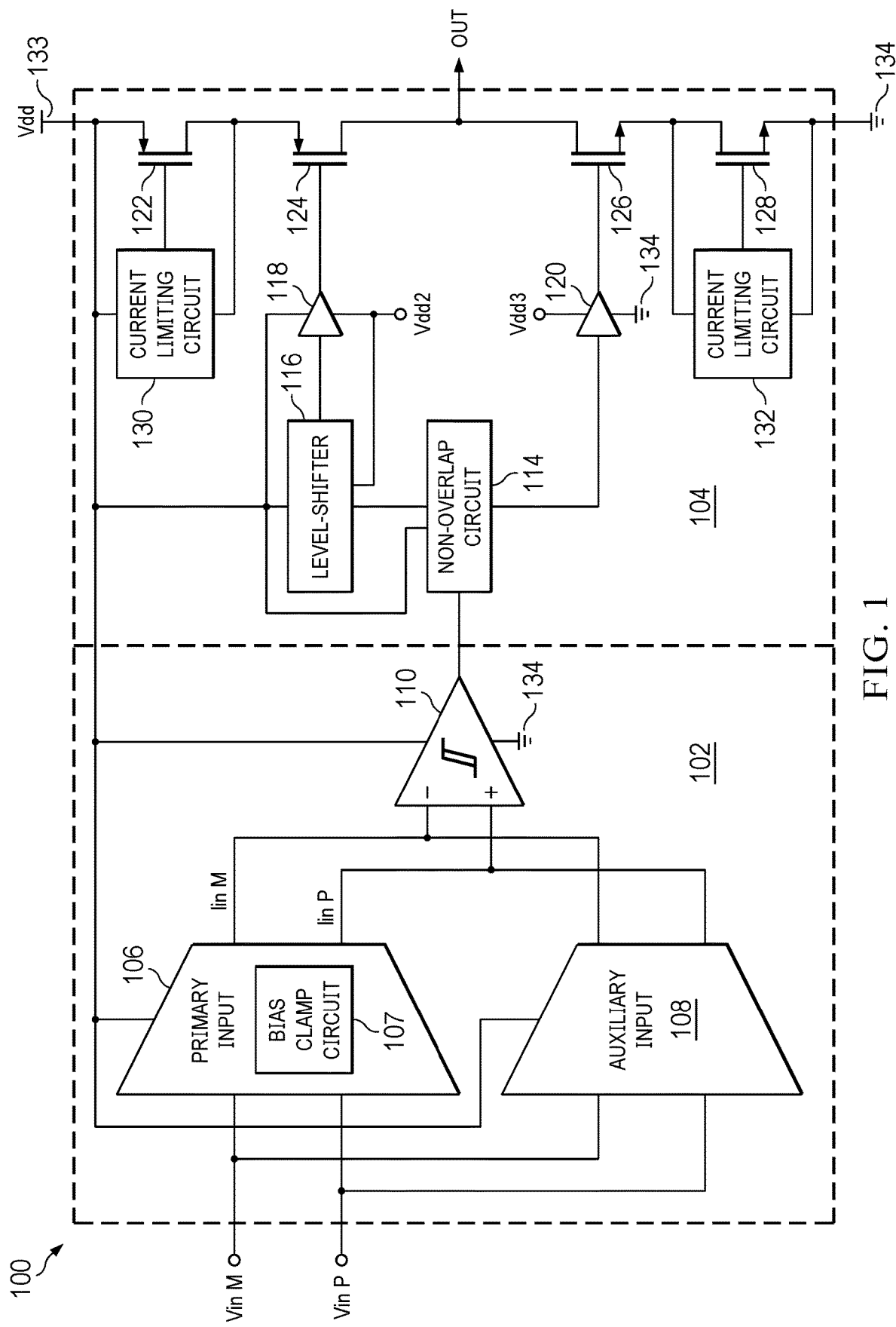
FIG. 1 is a block diagram of an example comparator.

As described above, parasitic elements are intrinsically, or in some cases inherently, occurring features that exist among, or between, circuit components such as conductive interconnects, doped regions of a semiconductor, etc. The parasitic elements can include parasitic inductance, parasitic capacitance, parasitic resistance, and the formation of parasitic BJTs between doped regions of a semiconductor, such as a FET. The presence of these parasitic elements may adversely affect operation of the circuit or circuit components, such as by causing uncontrolled, unintended, or unpredictable operation, altering a value of a signal provided in the circuit or by the circuit components in a manner not intended by an architecture in which the circuit components are arranged and coupled, etc. For example, the presence of parasitic BJTs in FETs of a differential input pair, such as of an input stage of a comparator or other device, can cause unpredictable or erroneous operation of the FETs. For example, when an input pin of a first FET (e.g., a gate of the first FET) of the differential pair rapidly becomes more negative with respect to an input pin of a second FET of the differential pair, a phase change in an output signal may occur (e.g., an output toggles from logic 1 value to logic 0 value, or vice versa). However, the phase change may be erroneous, such as in an implementation of a comparator including the differential pair, because an input signal did not change phase to cause the output signal to change phase.

Examples of this description provide for a bias clamp circuit. While described herein as a bias clamp circuit, the teachings of this description may be equally applicable to other application environments, such as clamping a signal voltage for a signal other than a bias signal or bias voltage. The bias clamp circuit couples to a differential pair, such as to prevent a bias node of the differential pair from decreasing in value to be less than a bias threshold value. For example, the bias clamp circuit couples to a bias node that is coupled to bodies of each FET of the differential pair. A bias source couples to the bias node and provides a bias voltage (b_bias) at the bias node. Responsive to a decrease in value of a negative component of an input signal of the differential pair to cause it to become more negative with respect to a positive component of the input signal, parasitic BJTs of the FETs may cause the FETs to become debiased, causing b_bias to decrease in value. As used herein, the FET becoming debiased means the bias point of the FET changing from a specified value (such as specified via a component arrangement of a circuit architecture), or the bias point becoming floating or high impedance.

In an example, the bias clamp circuit detects the decrease in value of b_bias and clamps b_bias to the bias threshold value, preventing b_bias from decreasing to be less than the bias threshold value. The bias threshold value may be a value of a reference voltage (Vref), or a value of Vref plus or minus a voltage characteristic associated with the bias clamp circuit. In some examples, the bias threshold value is Vref minus a gate-to-source threshold voltage of a FET of the bias clamp circuit. Clamping b_bias to the bias threshold value, in some examples, prevents debiasing of the differential pair, and thereby preventing a phase change in an output signal determined based on the input signal.

FIG. 1 is a block diagram of an example comparator 100. The comparator 100 may be implemented in a circuit or device (not shown) to compare first and second input signals to provide an output signal having a value indicative of a relationship between the first and second input signals. In an example, the comparator 100 includes an amplifier stage 102 and a switching stage 104. The amplifier stage 102 includes a primary input circuit 106 including a bias clamp circuit 107, an auxiliary input circuit 108, and a gain circuit 110. The switching stage 104 includes a non-overlap circuit 114, a level-shifter 116, a driver 118, a driver 120, a transistor 122, a transistor 124, a transistor 126, a transistor 128, a current limiting circuit 130, and a current limiting circuit 132. Although not shown in FIG. 1, in some examples, the auxiliary input circuit 108 also includes a bias clamp circuit, such as the bias clamp circuit 107.

In an example architecture of the comparator 100, the comparator 100 has first, second, third, and fourth inputs, and has an output. The primary input circuit 106 has a first input coupled to the first input of the comparator 100 and to a first input of the auxiliary input circuit 108, a second input coupled to the second input of the comparator 100 and to a second input of the auxiliary input circuit 108, and a third input coupled to third input of the comparator 100. In an example, the first input of the comparator 100 receives the first input signal, the second input of the comparator 100 receives the second input signal, and the third input of the comparator 100 is coupled to a voltage supply terminal 133 to receive a supply voltage (Vdd). The primary input circuit 106 has an output coupled to a first input of the gain circuit 110 and the auxiliary input circuit 108 has an output coupled to a second input of the gain circuit 110. In some examples, the gain circuit 110 is a differential amplifier in which its first input is a negative or inverting input and its second input is a positive or non-inverting input.

The non-overlap circuit 114 has an input coupled to an output of the gain circuit 110, and has first and second outputs. The level-shifter 116 has an input coupled to the first output of the non-overlap circuit 114, and has an output. The driver 118 has a first input coupled to the output of the level-shifter 116, a second input coupled to the voltage supply terminal 133, a third input at which a second supply voltage (Vdd2) is provided, and an output. The driver 120 has a first input coupled to the second output of the non-overlap circuit 114, a second input at which a third supply voltage (Vdd3) is provided, a third input coupled to a ground terminal 134 at which a ground voltage potential is provided, and an output. The transistor 122 has source coupled to the voltage supply terminal 133, a gate coupled to the current limiting circuit 130, and a drain. The transistor 124 has a source coupled to the drain of the transistor 122, a gate coupled to the output of the driver 118, and a drain coupled to the output of the comparator 100. The transistor 126 has a drain coupled to the drain of the transistor 124 and the output of the comparator 100, a gate coupled to the output of the driver 120, and a source. The transistor 128 has a drain coupled to the source of the transistor 126, a gate coupled to an output of the current limiting circuit 132, and a source coupled to the ground terminal 134.

The current limiting circuit 130 is also coupled to the voltage supply terminal 133 and the drain of the transistor 122. The current limiting circuit 132 is also coupled to the ground terminal 123 and the source of the transistor 128. In some examples, the current limiting circuit 130 includes an analog architecture that compares a reference current to a current flowing through a scaled replica of the transistor 122. Responsive to the current flowing through the scaled replica of the transistor 122 exceeding the reference current, the current limiting circuit 130 controls the transistor 122 to turn off, or to reduce its forward conductivity. In some examples, the current limiting circuit 132 also includes an analog architecture that compares a reference current to a current flowing through a scaled replica of the transistor 128. Responsive to the current flowing through the scaled replica of the transistor 128 exceeding the reference current, the current limiting circuit 132 controls the transistor 128 to turn off, or to reduce its forward conductivity.

In an example of operation of the comparator 100, a positive component of a differential input signal (VinP) is received at the first input of the comparator 100 (e.g., at the first input of the primary input circuit 106) and a negative component of the differential input signal (VinM) is received at the second input of the comparator 100 (e.g., at the second input of the primary input circuit 106). In an example, the primary input circuit 106 and the auxiliary input circuit 108 form pre-amplifier stages that increase power of the VinM and VinP to form IinM and IinP. The primary input circuit 106 and the auxiliary input circuit 108 are therefore pre-amplifier stages to the gain (or amplifier) circuit 110. In an example, the primary input circuit 106 is operable for input common mode voltages in a range of about 0.2 volts (V) to about Vdd−1.5 V, and the auxiliary input circuit 108 is operable for input common mode voltages in a range of about Vdd−1.5V to about Vdd+0.2 V. Thus, depending on the common mode voltage of VinM and VinP, either the primary input circuit 106 or the auxiliary input circuit 108 provides IinM and IinP.

The gain circuit 110 provides a single-ended (e.g., non-differential) analog output signal based on the differential signals (e.g., IinM and IinP) received from the primary input circuit 106 and/or the auxiliary input circuit 108. In an example, the gain circuit 110 includes, or is, an amplifier, such as a differential amplifier. The gain circuit 110 provides the analog output signal to the non-overlap circuit 114, which provides first and second digital output signals for driving the transistor 124 and the transistor 126, respectively.

In an example, the non-overlap circuit 114 includes digital logic gates coupled in an arrangement to provide the first and second digital output signals based on the analog output signal such that the first and second digital output signals do not both have asserted values (e.g., a value of logic 0 for the first digital output signal and a value of 1 for the second digital output signal, or vice versa) at any given time. For example, the non-overlap circuit 114 may provide the first digital output signal having an asserted value and provide the second digital output signal having a deasserted value, or vice versa, at any given point in time. In some examples, the non-overlap circuit 114 may delay assertion of one of the first or second digital output signal at a transition point to cause both the first and second digital output signals to have deasserted values momentarily when toggling or changing states. The non-overlap circuit 114 provides the first digital output signal to the level-shifter 116, which performs level-shifting of the first digital signal from a first voltage domain to a second voltage domain that includes Vdd2.

The level-shifter 116 provides the level-shifted first digital signal to the driver 118, which operates in a same voltage domain as Vdd2 and drives the transistor 124 to be conductive, or non-conductive, based on a value of the level-shifted first digital signal. For example, responsive to the VinP having a value greater than VinM, the level-shifted first digital signal has a de-asserted value and the transistor 124 is controlled by the driver 118 to be turned off. Conversely, responsive to the VinP having a value lesser than VinM, the level-shifted first digital signal has an asserted value and the transistor 124 is controlled to be turned on. The transistor 124 being turned on causes OUT to have a value approximately equal to Vdd, or more generally, an asserted value. Similarly, the non-overlap circuit 114 provides the second digital signal to the driver 118, which operates in a same voltage domain as Vdd3 and drives the transistor 126 to be conductive, or non-conductive, based on a value of the level-shifted first digital signal. For example, responsive to the VinP having a value greater than VinM, the second digital signal has an asserted value and the transistor 126 is controlled by the driver 120 to be turned on. The transistor 126 being turned on causes OUT to have a value approximately equal to a ground voltage potential provided at the ground terminal 134, or more generally, a de-asserted value. Conversely, responsive to the VinP having a value lesser than VinM, the second digital signal has a de-asserted value and the transistor 126 is controlled to be turned off. The current limiting circuit 130 and the current limiting circuit 132 monitor current flowing through the transistors 122, 128 and, responsive to the current exceeding a programmed limit, reduce a gate voltage of the transistors 122, 128, respectively, to reduce the current to not exceed the programmed limit.

Figure 2:
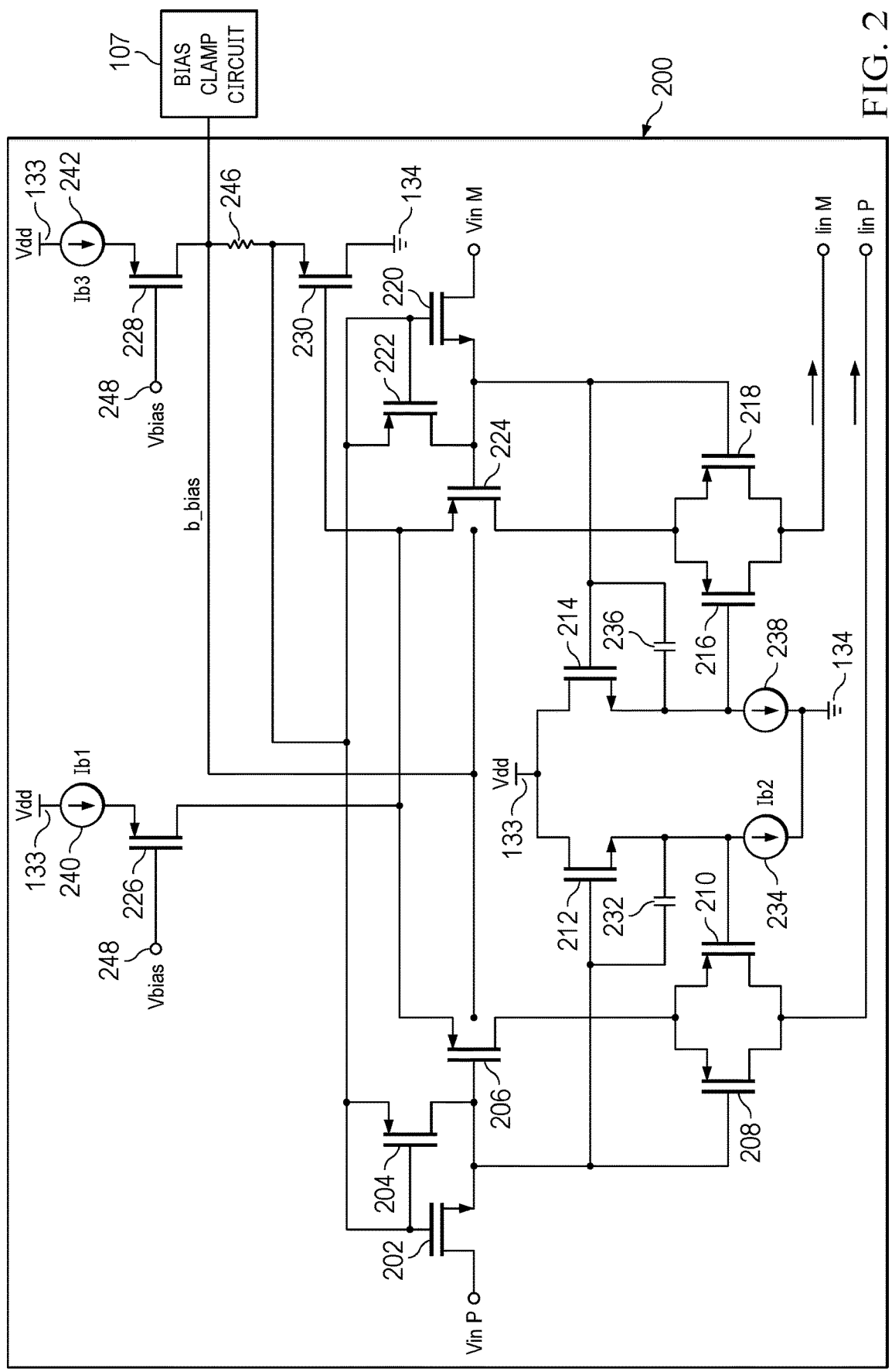
FIG. 2 is a schematic diagram of an example input circuit.

FIG. 2 is a schematic diagram of an example input circuit 200. In some examples, the input circuit 200 is of the comparator 100. For example, the input circuit 200 is suitable for implementation as the primary input circuit 106. Although the input circuit 200 is described herein with reference to the primary input circuit 106, in some examples, the input circuit 200 is also suitable for implementation as the auxiliary input circuit 108. In other examples, the input circuit 200 is of any other device that includes a differential input pair. The input circuit 200 includes transistors 202, 204, 206, 208, 210, 212, 214, 216, 218, 220, 222, 224, 226, 228, and 230, a capacitor 232, a current source 234, a capacitor 236, a current source 238, a current source 240, a current source 242, and a resistor 246. The input circuit 200 also includes (as shown in the implementation of the input circuit 200 as the primary input circuit 106 of FIG. 1), or is coupled to (as shown in FIG. 2), the bias clamp circuit 107. In an example, the transistors 202, 212, 214, and 220 are n-channel metal oxide semiconductor (NMOS) transistors. The transistors 202, 212, 214, and 220 may be drain-extended NMOS (DENMOS) transistors, such as to facilitate operation of the input circuit 200 at increased voltages in comparison to transistors that are not drain-extended. In an example, the transistors 204, 206, 208, 210, 216, 218, 222, 224, 226, 228, and 230 are p-channel metal oxide semiconductor (PMOS) transistors. The transistors 206, 208, 210, 216, 218, 222, 226, 228, and 230 may be drain-extended PMOS (DEPMOS) transistors, such as to facilitate operation of the input circuit 200 at increased voltages in comparison to transistors that are not drain-extended.

In an example architecture of the input circuit 200, the transistor 202 has a drain at which VinP is provided, and has a gate and a source. The transistor 204 has a gate and a source coupled to the source of the transistor 202, and has a drain coupled to the source of the transistor 202. The transistor 206 has a gate coupled to the source of the transistor 202, and has a source and a drain. The transistor 208 has a gate coupled to the source of the transistor 202, a source coupled to the drain of the transistor 206, and a drain at which a positive component of a differential output signal (IinP) of the input circuit 200 is provided. The transistor 210 has a source coupled to the drain of the transistor 206, a drain coupled to the drain of the transistor 208, and has a gate. The transistor 212 has a gate coupled to the source of the transistor 202, a drain coupled to the voltage supply terminal 133, and a source coupled to the gate of the transistor 210. The transistor 214 has drain coupled to the voltage supply terminal 133, and has a gate and a source. The transistor 216 has a gate coupled to the source of the transistor 214, a drain at which a negative component of the differential output signal (IinM) of the input circuit 200 is provided, and has a source. The transistor 218 has a drain coupled to the drain of the transistor 216, a source coupled to the source of the transistor 216, and has a gate. The transistor 220 has a drain at which VinM is provided, a source coupled to the gate of the transistor 218, and has a gate. The transistor 222 has a gate coupled to the gate of the transistor 220, a source coupled to the gate of the transistor 220, and a drain coupled to the source of the transistor 220. The transistor 224 has a gate coupled to the source of the transistor 220, a drain coupled to the source of the transistor 216, and a source coupled to the source of the transistor 206. In an example, the transistor 224 has a bulk coupled to a bulk of the transistor 206. The transistor 226 has a gate at which a bias voltage (Vbias) is provided, a drain coupled to the source of the transistor 206, and has a source. In an example, Vbias has a value approximately two diode drops less than Vdd and is provided by a current source (not shown) coupled to the voltage supply terminal 133. The transistor 228 has a gate at which Vbias is provided, a drain coupled to the bulks of the transistors 206 and 224, and has a source. The transistor 230 has a gate coupled to the source of the transistor 224, a source coupled to the gate of the transistor 202, and a drain coupled to the ground terminal 134.

The capacitor 232 has a first terminal coupled to the gate of the transistor 212 and a second terminal coupled to the source of the transistor 212. The current source 234 has a first terminal coupled to the source of the transistor 212 and a second terminal coupled to the ground terminal 134. The capacitor 236 has a first terminal coupled to the gate of the transistor 214 and a second terminal coupled to the source of the transistor 214. The current source 238 has a first terminal coupled to the source of the transistor 214 and a second terminal coupled to the ground terminal 134. The current source 240 has a first terminal coupled to the voltage supply terminal 133 and a second terminal coupled to the source of the transistor 226. The current source 242 has a first terminal coupled to the voltage supply terminal 133 and a second terminal coupled to the source of the transistor 228. The resistor 246 has a first terminal coupled to the drain of the transistor 228 and a second terminal coupled to the source of the transistor 230. In an example, the bias clamp circuit 107 couples to the drain of the transistor 228. In an example, b_bias is provided at the drain of the transistor 228.

In an example of operation of the input circuit 200, the transistors 206, 224 form a differential input pair. In some examples, VinP and/or VinM may have a voltage as high as approximately 40 V, or greater. However, this voltage may exceed a safe operating range for voltages provided at the gates of the transistors 206, 224. The transistors 202, 220 protect the transistors 206, 224, respectively, by limiting a reverse source-to-gate voltage (Vsg) of the transistors 206, 224 to approximately 2*Vsg (e.g., Vsg of the transistor 206 and the transistor 230). This arrangement protects the transistors 206, 224 from damage resulting from a high voltage of VinP and/or VinM. The transistors 204, 222 operate as Vgs clamps for the transistors 202, 220, limiting Vgs of the transistors 202, 220. The bulk of the transistors 206, 224 receive b_bias to increase the threshold voltages of the transistors 206, 224 to increase a bias margin of the transistors 206, 224. The transistors 208 and 210 are cascode protection devices for the transistor 206, and the transistors 216, 218 are cascode protection devices for the transistor 224. The transistors 212, 214 form a level-shifter that biases the gates of the transistors 210, 216 to increase the bias margin for the transistors 206, 224. The capacitors 232, 236 increase transient response performance of the level-shifter formed by the transistors 212, 214.

Responsive to receipt of VinP and VinM by the input circuit 200, current Ib1 provided by the current source 240 is steered between the transistors 206, 224 such that IinM+IinP=Ib1, and IinP−IinM is the differential signal current of the output signal of the input circuit 200. In an example, b_bias is provided during normal operation of the input circuit 200 having a value based on a resistance of the resistor 246 and a value of the current Ib3. Ib3 is provided by the current source 242, which is protected by the cascode transistor 228. In an example, the transistor 230 provides a signal at its source to the gates of the transistors 202, 220 to bias the gates of the transistors 202, 220.

In some examples, a parasitic NPN bi-polar junction transistor (BJT) (not shown) forms between VinM (e.g., the drain of the transistor 220), having an emitter at the drain of the transistor 220, a collector at the bulk of the transistors 206, 224, and a base coupled to the ground terminal 134. Responsive to VinM decreasing in value, such as to approximately −0.7 V, the NPN BJT turns on and forward biases a source-bulk junction of the transistors 206, 224. This forward biasing causes Ib1 to flow through the NPN BJT, reducing IinM and IinP to approximately zero and causing an erroneous output signal with respect to a value of VinM and VinP.

To mitigate the providing of an erroneous output signal in such a circumstance, the bias clamp circuit 107 clamps a value of b_bias to a programed value. For example, the bias clamp circuit 107 prevents b_bias from decreasing below the bias threshold value, thereby preventing the NPN BJT from forward biasing the source-bulk junction of the transistors 206, 224. By preventing the NPN BJT from forward biasing the source-bulk junction of the transistors 206, 224, the bias clamp circuit 107 mitigates the input circuit 200 providing an erroneous output signal with respect to a value of VinM and VinP, as described above.

Figure 3:
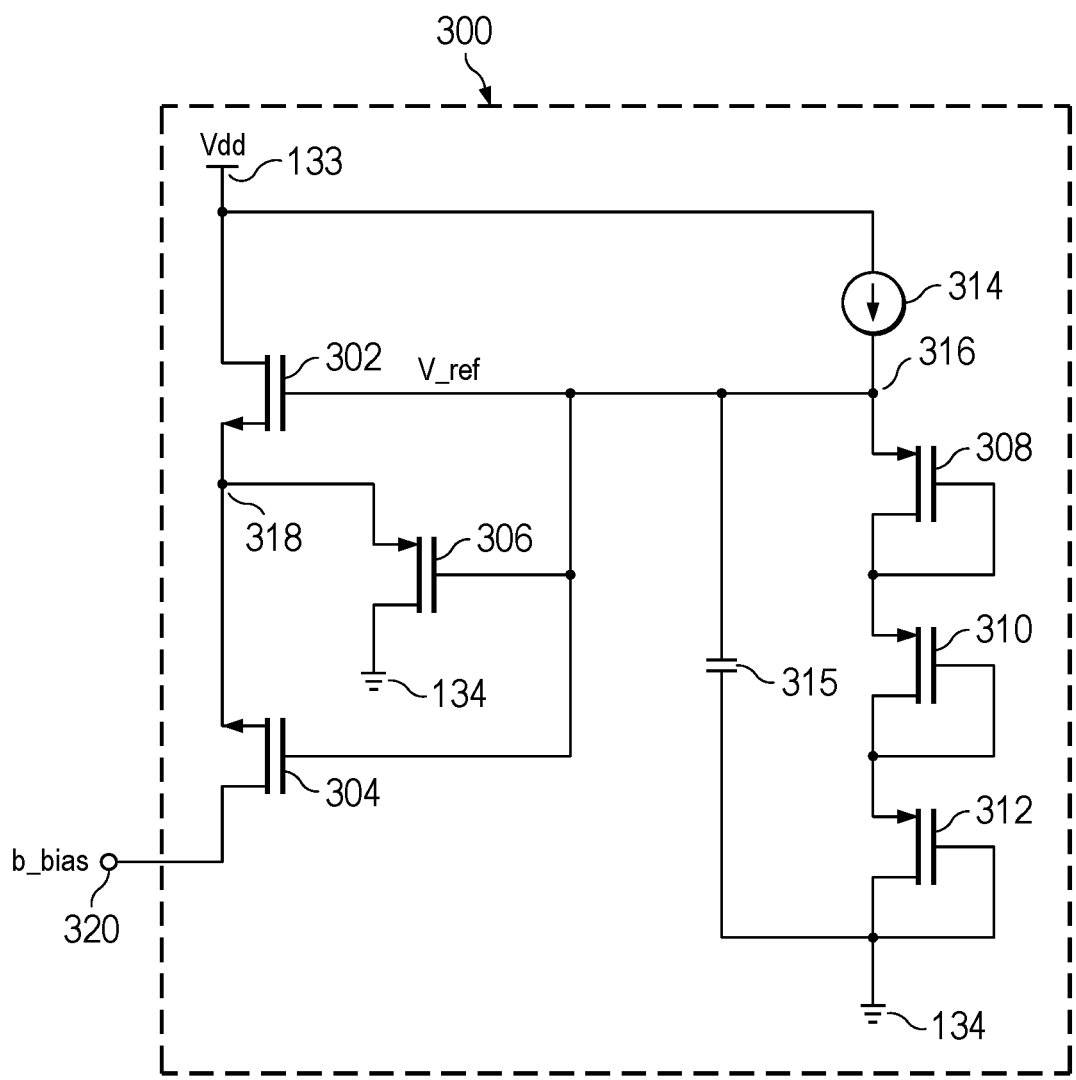
FIG. 3 is a schematic diagram of an example of a bias clamp circuit.

FIG. 3 is a schematic diagram of an example of a bias clamp circuit 300. In some examples, the bias clamp circuit 300 is of the comparator 100, such as of, or coupled to, the primary input circuit 106. In other examples, the bias clamp circuit 300 is of any other device that includes a differential input pair. The bias clamp circuit 300 includes transistors 302, 304, 306, 308, 310, and 312, and a current source 314. In an example, the transistors 302, 304 are NMOS transistors. The transistors 302, 304 may be DENMOS transistors. In an example, the transistors 306, 308, 310, and 312 are PMOS transistors. In some examples, the bias clamp circuit 300 also includes a capacitor 315.

In an example architecture of the bias clamp circuit 300, the transistor 302 has a drain coupled to the voltage supply terminal 133, and has a gate and a source. The transistor 304 has a source coupled to the source of the transistor 302, a gate coupled to the gate of the transistor 302, and has a drain. In an example, the bias clamp circuit 300 couples to another circuit at the drain of the transistor 304, such as to the drain of the transistor 228 of the input circuit 200 of FIG. 2, to clamp a voltage provided at the drain of the transistor 304 to a bias threshold value to prevent that voltage from decreasing below the bias threshold value. The transistor 306 has a gate coupled to the gate of the transistor 302, a source coupled to the source of the transistor 302, and a drain coupled to the ground terminal 134. The transistor 308 has a source coupled to the gate of the transistor 302, and has a gate, and a drain. The transistor 310 has a source coupled to the gate and the drain of the transistor 308, and has a gate and a drain. The transistor 312 has a source coupled to the gate and the drain of the transistor 310, and has a gate and a drain coupled to the ground terminal 134. The current source 314 has a first terminal coupled to the voltage supply terminal 133 and a second terminal coupled to the gate of the transistor 302. The capacitor 315 has a first terminal coupled to the node 316 and a second terminal coupled to the ground terminal 134.

As shown and coupled in FIG. 3, the transistors 308, 310, 312 are representative of a voltage clamp circuit. The current source 314, capacitor 315, and the voltage clamp circuit together are representative of a voltage supply, such as a reference voltage supply having an output at the node 316. In various examples, more or fewer transistors may be coupled with the transistors 308, 310, 312 to form the voltage clamp circuit, thereby modifying a clamp value of the voltage clamp circuit. In other examples, any one or more of the transistors 308, 310, 312 may be replaced by other components, such as diodes or other components or circuitry capable of functioning as a voltage clamp. Also, in some examples, the transistor 306 is omitted from the bias clamp circuit 300.

In an example of operation of the bias clamp circuit 300, a current is provided at node 316. The current may be provided by the current source 314, or by any other suitable component or circuit coupled to the node 316 in place of the current source 314. The current, in combination with the transistors 308, 310, 312, and capacitor 315 causes a voltage to be provided at the node 316. The transistors 308, 310, 312 forming the voltage clamp circuit, as described above, are each arranged and coupled in a diode-connected arrangement. In this diode-connected arrangement, the transistors 308, 310, 312 operate functionally as diodes. As such, each of the transistors 308, 310, 312 has a particular voltage drop between its source and drain terminals. By coupling the transistors 308, 310, 312 as shown in FIG. 3, the respective voltage drops of the transistors 308, 310, 312 add to form a combined voltage drop between the node 316 and the ground terminal 134. In this way, the voltage provided at the node 316 is clamped, or limited, to approximately equal to the combined voltage drop of the transistors 308, 310, 312 (or more generally, the voltage clamp circuit irrespective of its architecture). In an example, the voltage provided at the node 316 is referred to as V_ref. In an example, V_ref has a value such that V_ref is less than a gate-to-source voltage (Vgs) threshold (Vth) of the transistor 304 plus b_bias for all values of b_bias in a normal operating range of the input circuit 200. Responsive to b_bias decreasing in value, as described above outside of its normal operating range, V_ref becomes greater than the Vth of the transistor 304 plus b_bias and the transistor 304 turns on and clamps b_bias.

Conventionally, current flows through an NMOS transistor from the drain of the transistor to the source of the transistor. This may also be referred to as a NMOS transistor operating in a forward active mode. A NMOS transistor operating in a reverse active mode effectively inverts its operation with respect to its drain and source terminals. In this way, current flows from the source to the drain of the NMOS transistor, and the NMOS transistor turns on based on exceeding a gate-to-drain voltage (Vgd) threshold rather than exceeding a Vgs threshold. The transistor 304 is coupled in the bias clamp circuit 300 to operate in the reverse active mode. Thus, V_ref also has a value sufficient to exceed the Vgd threshold of the transistor 306 in response to a decrease in value of b_bias, as provided at the drain of the transistor 304.

For example, responsive to b_bias decreasing in value to cause V_ref minus b_bias to be greater than the Vgd threshold of the transistor 304, the transistor 304 turns on and becomes conductive. While conductive, the transistor 304 operates as a source-follower. The source-follower operation of the transistor 304 causes a voltage provided at the drain of the transistor 304 to approximately equal a value of V_ref minus Vgd of the transistor 304. As such, b_bias is prevented from decreasing below, or clamped to, the value of V_ref minus Vgd of the transistor 304. The transistor 302 also being turned on, or conductive, based on the value of V_ref limits a voltage provided at the source of the transistor 304 based on the Vgs of the transistor 302, protecting the transistor 304 from over-voltage damage. Responsive to b_bias increasing in value such that V_ref minus b_bias is no longer greater than the Vgd threshold of the transistor 304, the transistor 304 turns off.

In some examples, such as examples in which the bias clamp circuit 300 is implemented as the bias clamp circuit 107 of FIG. 2, clamping b_bias to the value of V_ref minus Vgd of the transistor 304 prevents the input circuit 200 from becoming de-biased and providing an incorrect output, as described elsewhere herein. In such examples, the bias clamp circuit 300 couples at the node 320 to the input circuit 200 such that b_bias is provided at the node 320. In other examples, the bias clamp circuit 300 couples at the node 320 to a node at which a voltage is provided that is to be clamped to a voltage specified by the bias clamp circuit 300. In some examples, the transistor 306 functions as a clamp to limit the node 318 to a value of approximately a Vsg of the transistor 306 plus V_ref.

Figure 4:
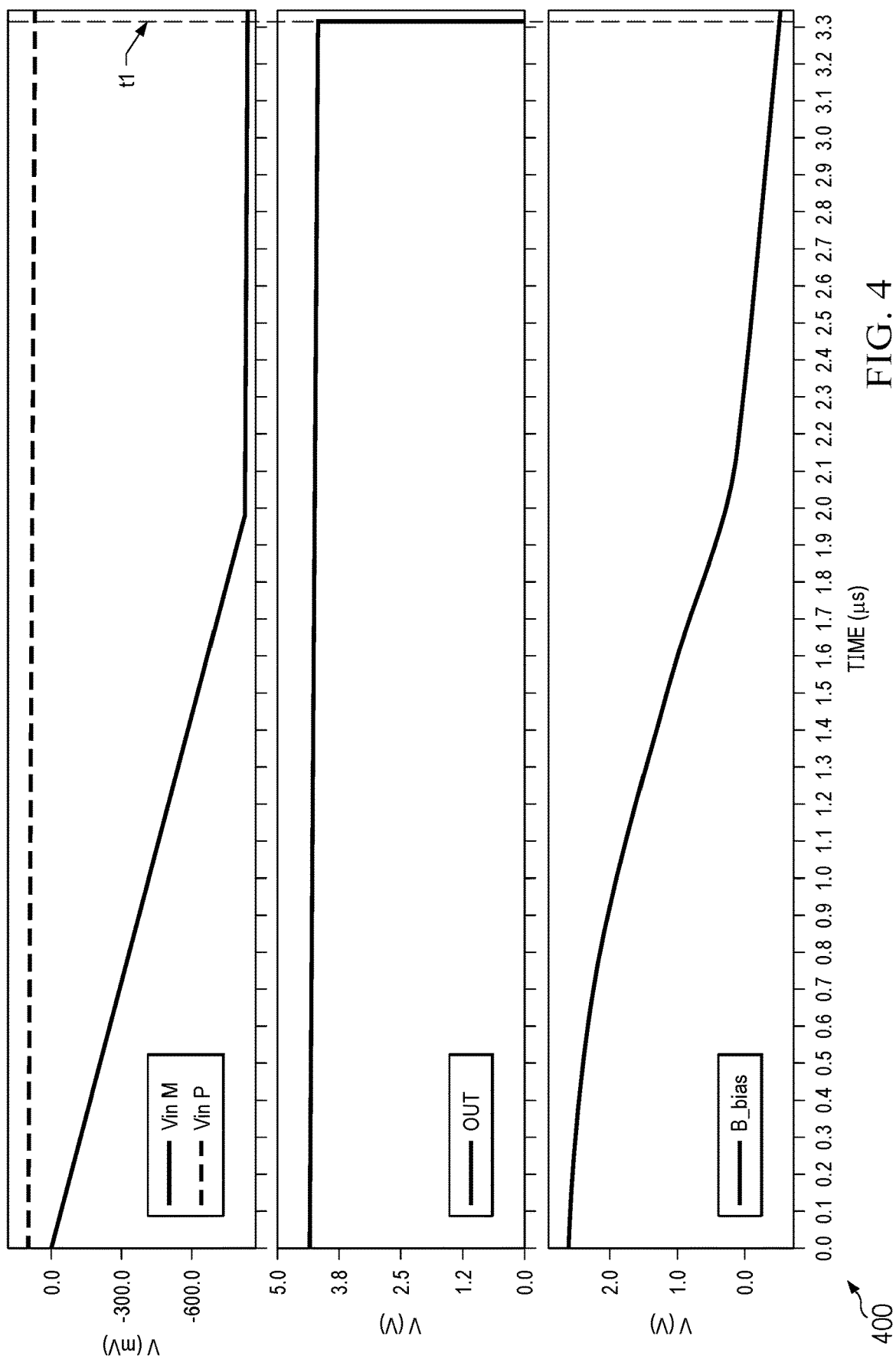
FIG. 4 is a diagram of example signal waveforms for an example comparator not including a bias clamp circuit.

FIG. 4 is a diagram 400 of example signal waveforms for an example comparator not including a bias clamp circuit. For example, the diagram 400 is representative of at least some signals provided in the comparator 100 including the input circuit 200 as the primary input circuit 106, but not including the bias clamp circuit 107 or 300. The diagram 400 includes VinP, VinM, OUT, and b_bias. The diagram 400 is shown having vertical axes representative of voltage in units of millivolts (mV) or V and a horizontal axis representative of time in units of microseconds (us).

As shown by the diagram 400, responsive to VinM rapidly decreasing in value with respect to VinP, b_bias also decreases in value, becoming negative in value. As described above with respect to FIG. 2, the decrease in value of b_bias causes the input circuit 200 to become de-biased. As shown by the diagram 400, the de-biasing of the input circuit 200 causes OUT to toggle in value at time t1 from a voltage representative of a logic 1 value, representing VinP being greater in value than VinM, to a voltage representative of a logic 0 value, representing VinP being lesser in value than VinM. Such a change occurs despite VinP maintaining its value greater than that of VinM.

Figure 5:
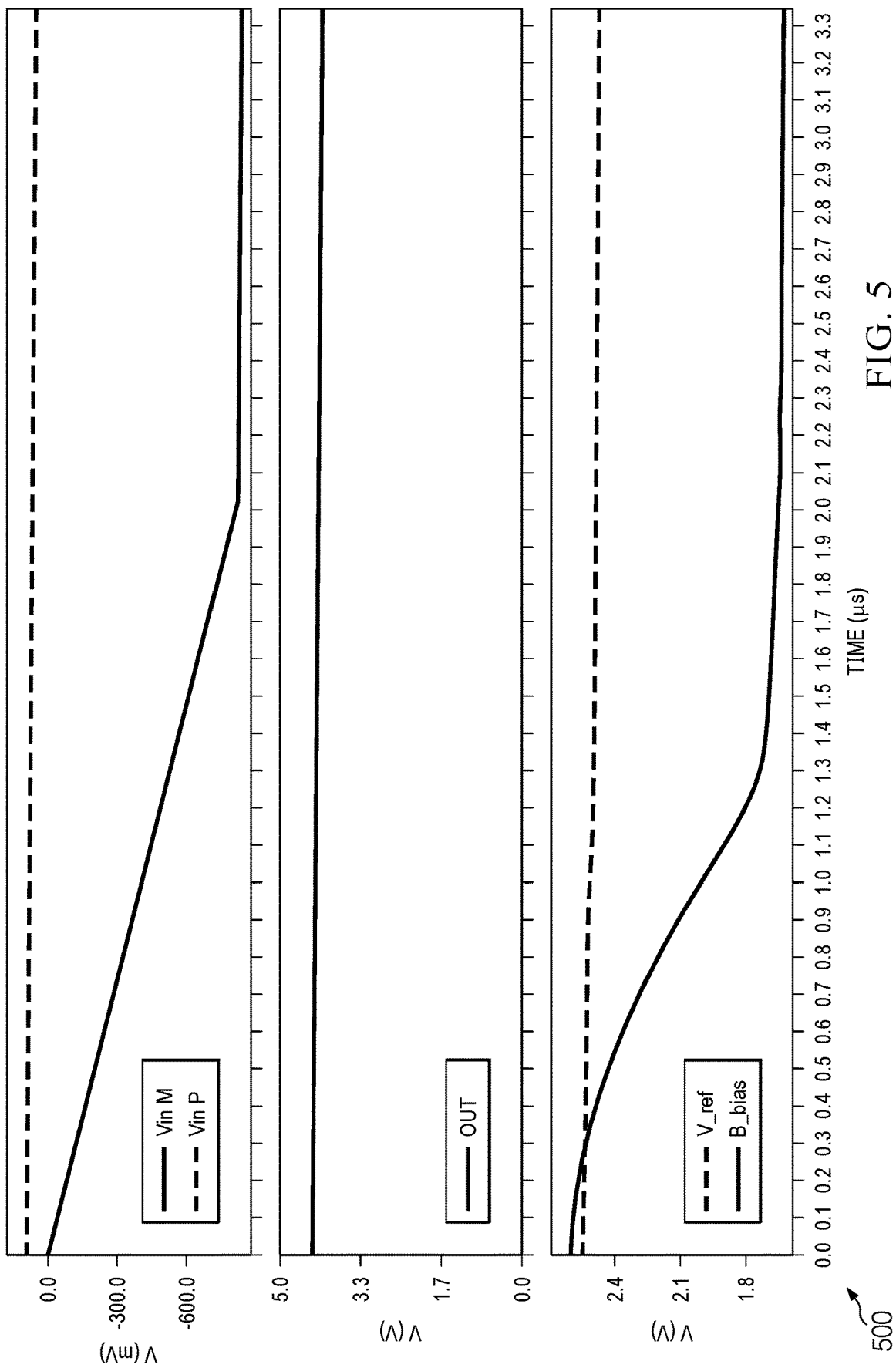
FIG. 5 is a diagram of example signal waveforms for an example comparator including a bias clamp circuit.

FIG. 5 is a diagram 500 of example signal waveforms for an example comparator including a bias clamp circuit. For example, the diagram 500 is representative of at least some signals provided in the comparator 100 including the input circuit 200 as the primary input circuit 106 and the bias clamp circuit 300 as the bias clamp circuit 107. The diagram 500 includes VinP, VinM, OUT, V_ref, and b_bias. The diagram 400 is shown having vertical axes representative of voltage in units of mV or V and a horizontal axis representative of time in units of us.

As shown by the diagram 500, responsive to VinM rapidly decreasing in value with respect to VinP, b_bias also decreases in value. As described above with respect to FIG. 3, the bias clamp circuit 300 activates responsive to the decrease in value of b_bias, clamping b_bias to a value of approximately V_ref minus Vgd of the transistor 304 (e.g., approximately 0.87 V in the example of diagram 500). The clamping of b_bias to a value approximately equal to V_ref minus Vgd of the transistor 304 prevents de-biasing of the input circuit 200, as described above, also preventing the change in value of OUT without a corresponding change in polarity or value of VinP with respect to VinM.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. Components shown as capacitors, unless otherwise stated, are generally representative of any one or more elements coupled in series and/or parallel to provide an amount of capacitance represented by the shown capacitor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus comprising:
   a first transistor having a source, a gate, and a drain, the drain of the first transistor coupled to a voltage supply terminal;
   a second transistor having a source, a gate, and a drain, the gate of the second transistor coupled to the gate of the first transistor, and the source of the second transistor coupled to the source of the first transistor;
   a third transistor having a first terminal and a bulk, the bulk of the third transistor coupled to the drain of the second transistor;
   a fourth transistor having a first terminal and a bulk, the bulk of the fourth transistor coupled to the drain of the second transistor and the first terminal of the fourth transistor coupled to the first terminal of the third transistor; and
   reference voltage supply coupled to the gates of the first and second transistors, wherein the reference voltage supply comprises:
   a current source having first and second terminals;
   a capacitor having a first terminal coupled to the second terminal of the current source and having a second terminal coupled to a ground terminal; and
   a voltage clamp circuit coupled to the second terminal of the current source and the ground terminal.

2. The apparatus of claim 1, wherein the voltage clamp circuit includes:
   a third transistor having a gate, a source, and a drain, the source of the third transistor coupled to the second terminal of the current source, and the gate of the third transistor coupled to the drain of the third transistor;
   a fourth transistor having a gate, a source, and a drain, the source of the fourth transistor coupled to the drain of the third transistor, and the gate of the fourth transistor coupled to the drain of the fourth transistor; and
   a fifth transistor having a gate, a source, and a drain, the source of the fifth transistor coupled to the drain of the fourth transistor, the gate of the fifth transistor coupled to the ground terminal, and the drain of the fifth transistor coupled to the ground terminal.

3. The apparatus of claim 1, wherein the voltage clamp circuit includes a diode-connected transistor.

4. The apparatus of claim 1, further comprising:
   another current source having first and second terminals;
   a fifth transistor having a gate, a source, and a drain, the source of fifth transistor coupled to the second terminal of the another current source, and further coupled to the bulks of the third and fourth transistors, and the drain of the fifth transistor coupled to the bulks of the third and fourth transistors;
   a sixth transistor having a gate, a source, and a drain, the gate of the sixth transistor coupled to the source of the fourth transistor, the source of the sixth transistor coupled to the drain of the fifth transistor, and further coupled to the sources of the third and fourth transistor, and the drain of the sixth transistor coupled to the ground terminal; and
   a resistor coupled between the source of the sixth transistor and the drain of the fifth transistor.

5. The apparatus of claim 4, further comprising:
   a seventh transistor having a gate, a source, and a drain, the gate of the seventh transistor coupled to the source of the seventh transistor and to the source of the sixth transistor, the source of the seventh transistor coupled to the gate of the fourth transistor; and
   an eighth transistor having a gate a source and a drain, the gate of the eighth transistor coupled to the gate of the seventh transistor, and the source of the eight transistor coupled to the gate of the fourth transistor.

6. The apparatus of claim 5, further comprising:
   a ninth transistor having a gate, a source, and a drain, the gate of the ninth transistor coupled to the gate of the fourth transistor, the source of the ninth transistor coupled to the drain of the fourth transistor; and
   a tenth transistor having a gate, a source, and a drain, the source of the tenth transistor coupled to the source of the ninth transistor, and the drain of the tenth transistor coupled to the drain of the ninth transistor.

7. The apparatus of claim 6, further comprising an eleventh transistor having a gate, a source, and a drain, the gate of the eleventh transistor coupled to the gate of the fourth transistor, and a source of the eleventh transistor coupled to the gate of the tenth transistor.

8. The apparatus of claim 7, further comprising another capacitor coupled between the gate of the eleventh transistor and the source of the eleventh transistor.

9. An apparatus comprising:
   a first transistor having a source, a gate, and a drain, the drain of the first transistor coupled to a voltage supply terminal;
   a second transistor having a source, a gate, and a drain, the gate of the second transistor coupled to the gate of the first transistor, and the source of the second transistor coupled to the source of the first transistor;
   a third transistor having a first terminal and a bulk, the bulk of the third transistor coupled to the drain of the second transistor; and
   a fourth transistor having a first terminal and a bulk, the bulk of the fourth transistor coupled to the drain of the second transistor and the first terminal of the fourth transistor coupled to the first terminal of the third transistor, wherein the first transistor and the second transistor are each drain-extended n-channel field effect transistors.

10. An apparatus comprising:
a first transistor having a source, a gate, and a drain, the drain of the first transistor coupled to a voltage supply terminal;
a second transistor having a source, a gate, and a drain, the gate of the second transistor coupled to the gate of the first transistor, and the source of the second transistor coupled to the source of the first transistor;
a differential input circuit comprising:
a third transistor having a first terminal and a bulk, the bulk of the third transistor coupled to the drain of the second transistor; and
a fourth transistor having a first terminal and a bulk, the bulk of the fourth transistor coupled to the drain of the second transistor and the first terminal of the fourth transistor coupled to the first terminal of the third transistor;
a current source having a first terminal, and having a second terminal;
a fifth transistor having a gate, a source, and a drain, the source of fifth transistor coupled to the second terminal of the current source, and the drain of the fifth transistor coupled to the bulks of the third and fourth transistors;
a resistor having a first terminal coupled to the drain of the fifth transistor, and having a second terminal, wherein a point of coupling of the drain of the fifth transistor to the bulks of the third and fourth transistors and to the first terminal of the resistor is a bias input of the differential input circuit; and
a sixth transistor having a gate, a source, and a drain, the gate of the sixth transistor coupled to the source of the fourth transistor, the source of the sixth transistor coupled to the second terminal of the resistor, and the drain of the sixth transistor coupled to a ground terminal.

11. The apparatus of claim 10, further comprising a reference voltage supply coupled to the gates of the first and second transistors.

12. The apparatus of claim 11, wherein the reference voltage supply includes:
another current source having a first terminal, and having a second terminal;
a capacitor having a first terminal coupled to the second terminal of the another current source and having a second terminal coupled to the ground terminal; and
a voltage clamp circuit coupled to the second terminal of the current source and the ground terminal.

13. The apparatus of claim 10, wherein the sixth transistor is a drain-extended p-channel field effect transistor.

14. The apparatus of claim 10, further comprising:
a seventh transistor having a gate, a source, and a drain, the gate of the seventh transistor coupled to the source of the seventh transistor and to the source of the sixth transistor, the source of the seventh transistor coupled to the gate of the fourth transistor; and
an eighth transistor having a gate a source and a drain, the gate of the eighth transistor coupled to the gate of the seventh transistor, and the source of the eight transistor coupled to the gate of the fourth transistor.

15. An apparatus comprising:
a bias clamp circuit having a bias terminal, the bias clamp circuit configured to prevent a value of bias voltage provided at the bias terminal from decreasing below a reference value, wherein the bias clamp circuit includes:
a reference voltage supply;
a first transistor having a source, a gate, and a drain, the gate of the first transistor coupled to the reference voltage supply, and the drain of the first transistor coupled to a voltage supply terminal; and
a second transistor having a source, a gate, and a drain, the gate of the second transistor coupled to the reference voltage supply, the source of the second transistor coupled to the source of the first transistor, and the drain of the second transistor coupled to the bias terminal; and
a differential input pair coupled to the bias terminal, including:
a third transistor having a first terminal and a bulk, the bulk of the third transistor coupled at the bias terminal to the drain of the second transistor; and
a fourth transistor having a first terminal and a bulk, the bulk of the fourth transistor coupled to the drain of the second transistor and the first terminal of the fourth transistor coupled to the first terminal of the third transistor.

16. The apparatus of claim 15, wherein the second transistor is configured to prevent the value of the bias voltage from decreasing to be less than a value of a reference voltage provided by the reference voltage supply minus a gate-to-source voltage of the second transistor.

17. The apparatus of claim 15, wherein the reference voltage supply includes:
a current source having a first terminal coupled to a second voltage supply terminal, and having a second terminal;
a capacitor having a first terminal coupled to the second terminal of the current source and having a second terminal coupled to a ground terminal; and
a voltage clamp circuit coupled to the second terminal of the current source and the ground terminal.

18. The apparatus of claim 17, wherein the voltage clamp circuit includes a diode-connected transistor.

19. The apparatus of claim 15, wherein the bias clamp circuit includes a fifth transistor having a gate, a source, and a drain, the gate of the fifth transistor coupled to the gate of the first transistor, the source of the fifth transistor coupled to the source of the second transistor, and the drain of the fifth transistor coupled to a ground terminal.

20. The apparatus of claim 15, wherein the bias clamp circuit includes:
a fifth transistor having a gate, a source, and a drain, the gate of the fifth transistor coupled to the gate of the first transistor, the source of the fifth transistor coupled to the source of the second transistor, and the drain of the fifth transistor coupled to a ground terminal;
a resistor having a first terminal coupled to the gate of the first transistor, and a second terminal coupled to the reference voltage supply; and
a capacitor having a first terminal coupled to the reference voltage supply, and a second terminal coupled to the ground terminal.

* * * * *